United States Patent [19]

Threewitt

[11] Patent Number: 5,949,696
[45] Date of Patent: Sep. 7, 1999

[54] DIFFERENTIAL DYNAMIC CONTENT ADDRESSABLE MEMORY AND HIGH SPEED NETWORK ADDRESS FILTERING

[75] Inventor: Norman Bruce Threewitt, Cupertino, Calif.

[73] Assignee: Cypress Semiconductor Corporation, San Jose, Calif.

[21] Appl. No.: 08/885,909

[22] Filed: Jun. 30, 1997

[51] Int. Cl.$^6$ .................................................. G11C 15/00
[52] U.S. Cl. ...................................... 365/49; 365/189.07
[58] Field of Search ................................. 365/49, 189.07; 711/108

[56] References Cited

U.S. PATENT DOCUMENTS

| | | | |
|---|---|---|---|
| 4,791,606 | 12/1988 | Threewitt | 365/49 |
| 5,036,486 | 7/1991 | Noguchi et al. | 365/189.07 X |
| 5,126,968 | 6/1992 | Hamamoto et al. | 365/49 |
| 5,130,945 | 7/1992 | Hamamoto et al. | 365/49 |
| 5,305,262 | 4/1994 | Yoneda | 365/189.05 |
| 5,319,589 | 6/1994 | Yamagata et al. | 365/49 |
| 5,321,651 | 6/1994 | Monk | 365/189.07 X |
| 5,383,146 | 1/1995 | Threewitt | 365/49 |
| 5,388,065 | 2/1995 | Yoneda | 365/49 |
| 5,394,353 | 2/1995 | Nusinov et al. | 365/49 |
| 5,422,838 | 6/1995 | Lin | 365/49 |
| 5,440,715 | 8/1995 | Wyland | 711/108 |
| 5,444,649 | 8/1995 | Memirovsky | 365/189.07 X |

FOREIGN PATENT DOCUMENTS

| | | |
|---|---|---|
| 0 515 103 A2 | 5/1992 | European Pat. Off. . |
| 0 532 316 A2 | 9/1992 | European Pat. Off. . |

OTHER PUBLICATIONS

Kazutami Arimoto et al., A Circuit Design of Intelligent Cache DRAM With Automatic Write–Back Capability, Apr. 1991, IEEE Journal of Solid–State Circuits.

Jose G. Deigado–Frias et al., A VLSI Interconnection Network Router Using a D–CAM with Hidden Refresh, 1996, IEEE.

Takeshi Hamamoto et al., A Flexible Search Managing Circuitry for High–Density Dynamic CAMS, Aug. 8, 1994, IEICE Trans Electron.

Masanori Hariyama and Michitaka Kameyama, A Collision Detection Processor for Intelligent Vehicles, Dec. 12, 1993, IEICE Trans Electron.

S. Jones, Design, Selection and Implementation of a Content–Addressable Memory for VLSI CMOS chip Architecture, May 3, 1988, IEE Proceedings.

Geunhoe Kim, Kwangsoo Seo, Moonkey Lee, Reconfigural Content Addressable Memory for ASIC Module Compiler Jan. 1995, IEEE.

Kazuo Kobayashi et al., An Experimental 16 kbit Nonvolatile Random Access Memory, Feb. 2, 1990, The Transactions of the IEICE.

Takeshi Ogura et al., A 336–kbit Content Addressable Memory for Highly Parallel Image Processing, 1996, IEEE.

John V. Oldfield et al., The Application of VLSI Content–addressable Memories to the Acceleration of Logic Programming Systems, May 11–15, 1987, IEEE.

(List continued on next page.)

Primary Examiner—Huan Hoang
Attorney, Agent, or Firm—Hunton & Williams

[57] ABSTRACT

The invention relates to a three-state content addressable memory cell with a comparison element operationally connected to the match line output that outputs a signal having (i) a first logic state in response to two inputs having different logic states and (ii) a second logic state in response to two inputs having the same logic states, a first data storage (element) having an input operationally connected to a first data input line and an output operationally connected to said comparison element, a second data storage element having an input operationally connected to a second data input line and an output operationally connected to an input to said comparison element, said content addressable memory cell storing a masked state by storing the same logic state on said first and said second storage elements, said match line output having no direct connection to said first and second data storage elements thereby providing operational isolation between said match line output and said storage elements.

19 Claims, 6 Drawing Sheets

D$^2$CAM Cell

OTHER PUBLICATIONS

W.B. Noghani, I.P. Jalowiecki, Yield and Cost Estimation for CAM_Based Parallel Processor, Aug. 7–8, 1995, IEEE.

Paul Sweazey et al., Cache Memory Requirements in RISC Computers, 1987, Electro.

Keikichi Tamaru, The Trend of Functional Memory Development, Nov. 11, 1993, IEICE Trans Electron.

Jon P. Wade and Charles G. Sodini, A Ternary Content Addressable Search Engine, Aug. 4, 1989, IEEE Journal of Solid State Circuits.

Jon P. Wade and Charles G. Sodini, Dynamic Cross–Coupled Bit–Line Content Addressable Memory Cell for High–Density Arrays, Feb. 1, 1987, IEEE Journal of Solid–State Circuits.

Dan Wilnai and Zwie Amitai, Speed LAN–Address Filtering with CAMS, Apr. 26, 1990, Electronic Design.

Tadato Yamagata et al., A 288–kb Fully Parallel Content Addressable Memory Using a Stacked–Capacitor Cell Structure, Dec. 12, 1992, IEEE Journal of Solid–State Circuits.

Figure 3 - D²CAM Cell

DIFFERENTIAL DYNAMIC CONTENT ADDRESSABLE MEMORY AND HIGH SPEED NETWORK ADDRESS FILTERING

The present invention relates to content addressable memory (CAM) cells. More specifically, the present invention relates to CAMs for use with telecommunication and data communication equipments for very high-speed network address filtering applications.

BACKGROUND OF THE INVENTION

Modern telecommunication networks are almost exclusively digital data networks. Practically all of these digital networks make use of some form of packet or block type data format to dynamically route data packets or blocks through the network. The advantages of dynamically routing packets or blocks of data through a network are well known. Advances in fiber optic transmission, protocols and modulation schemes also make possible very high-speed data transfer rates in these modern networks. However, these high-speed data transfer rates and attendant high-speed packet rates can create communication bottlenecks at the router or switch junction between high-speed data links. One cause of communication bottlenecks and increased router latency is the finite processing power available at the network router to determine where to route or "switch" an incoming data packet.

Consider, for example, the typical packet-based communications network where each packet of data contains address fields at the beginning of each packet (e.g., the "header" of the packet, defining, inter alia, a source and/or destination address of the packet). In most promulgated standards for packet type transmission, these address fields are long binary numerals; e.g., in the IEEE 802.3 Ethernet standard each address field is 48 bits. Long addresses are necessary to accommodate potentially very large networks with many individual addressees. This type of packet data is typically found in the Network layer (layer 3) of the Open Systems Interconnect (OSI) network model. However, some OSI layer 2 protocols also have sufficient address information to facilitate high-speed routing.

One illustrative example of an appropriate application of very high-speed packet routing involves certain protocol inefficiencies that may arise when supporting a layer 3 protocol on or within a layer 2 protocol. For example, one design consideration in expanding a Local Area Network (LAN) involves the data rate trade-offs that arise from the way the Carrier Sense Multiple Access with Collision Detection (CSMA/CD) method (an OSI layer 2 protocol) resolves carrier collisions. A CSMA/CD LAN can support many users. However, as overall bandwidth demand increases, the time-out or wait state caused by carrier "collisions" can greatly increase the latency of the network. For this reason, LAN extensions often use a bridge in the data link layer (OSI layer 2) to segment a LAN and isolate high-traffic segments to prevent performance degradations across the network.

In the ideal case, a bridge should make a "real-time" routing decision, (that is, decide to which port a given packet should be routed) within the packet transmission interval. The packet transmission interval is the time it takes to communicate a packet to the router or bridge. The routing decision may be accomplished by searching a station list stored in the bridge for the packet's destination address. Additionally, a search and qualified modification of the station list for the packet's source address allows the bridge to "learn" the network. For example, if a packet's source address is not in the station list, the "new" source address and the port associated with the new source address can be added to the station list. Thus, when the author of a packet subsequently becomes a recipient of a packet the station list will contain the appropriate entry.

In order to prevent excessive packet delay in the bridge, these two searches should be performed within a packet transmission interval. Thus, the searches should be accomplished very quickly. The packet transmission interval, and hence the routing decision period, may be very small in high-data rate networks such as those employing 100 Base T and 1000 Base-cx Ethernet protocols.

The searching of a station list for source and destination addresses and routing packets to the right port(s) may be referred to as "Network Address Filtering," or NAF.

There are several conventional search means used for network address filtering including hashing algorithms, binary searches, and CAMs (Content Addressable Memories).

Hashing algorithms and binary searches can be accomplished via software or with hardware-based accelerators. However, both of these methods have technical and practical limitations.

Hashing algorithm methods may be cost-effective, but slow, relative to the time allotted for searching, especially for a sparsely populated list. For example, the 48 bit IEEE 802.x address formats provide an address space of $2^{48}$ or 256 trillion ($2.56 \times 10^{14}$) possible addresses. A typical network application, however, may use only a few thousand addresses, thus creating a sparsely populated list. The hashing algorithm is a very inefficient means for searching a sparsely populated list. The frequent occurrence of a sparsely populated list in practical applications makes the hashing algorithm an inefficient method for NAF.

Station lists characteristically contain addresses in the order of thousands. Consequently, binary searches can be done somewhat efficiently (e.g., 12 clock cycles for a 4000 or $2^{12}$ entry list). However, the binary search algorithm has overhead processing costs that create practical implementation difficulties. Binary searching of station lists may, thus, increase the risk of occasionally large network routing delays. For example, a binary search requires a sorted list (i.e. where the addresses, are sorted in ascending or descending order) before a binary search algorithm can be used. Thus, when a new address entry occurs in binary searching using a sorted list, the list must be resorted before a routing decision can be made by the binary search method. Sorting the list may be a time-consuming operation that delays network routing decisions. Because network protocol standards support such large networks, network "events" (such as port failures, backbone failures, power outages and the like) may occur more frequently than in smaller networks. Each time a network "event" occurs, the network routing table (or station list) may be updated with new routing information. In large networks, new list entries or deletions may happen more frequently as a function of the number of network "events", or percentage of the availability of network resources, and the problem of having to re-sort the list can arise more often. In general, network planners and engineers seek to avoid this risk.

A further disadvantage to the hashing and binary search algorithms is an indeterminate search time. That is, these algorithms have a search time that varies with each network transaction depending on a given entry's position in the sorted list. Thus, giving these algorithms a factor beyond the engineer's absolute control. Furthermore, to determine the absence of a given entry in this list, the entire list must be searched.

The highest performance searching is accomplished using a CAM. Unfortunately, to date, conventional CAMs have been a relatively expensive form of memory on a cost-per-bit basis.

A discussion on CAMS in telecommunication networks can be organized into three categories: (1) CAMS, (2) CAM applications and (3) Network Address Filtering.

A CAM differs from a RAM in that a CAM adds a comparison logic function to every memory cell. This added functionality raises the component count in each cell by the number of transistors or other components/circuit elements needed to perform the comparison function, but adds a "parallel processing" characteristic to the CAM memory array.

Conventional CAMs used in NAF applications typically use 9-or 10- transistor static cells. The conventional CAM cell comprises a Static Random Access Memory (SRAM) and an Exclusive Negative OR (XNOR) logic function. A six(6)- transistor SRAM cell with a four(4)- transistor XNOR Gate is shown in FIG. 1.

TABLE 1

Static CAM Truth Table

| Data (BL) | Comparand (C) | Match Line |
|---|---|---|
| 0 | 0 | 1 |
| 0 | 1 | 0 |
| 1 | 0 | 0 |
| 1 | 1 | 1 |

It is assumed that a load impedance external to the cell is used to pull up each Match line output. Note from FIG. 1 that $Q_4$ and $Q_8$ are P-Channel MOSFETs in a conventional six-transistor SRAM cell. All other transistors are N-Channel. The conventional CAM cell truth table is shown in Table 1.

This conventional CAM cell occupies an area roughly twice that of an SRAM cell. In addition, a conventional CAM function requires a priority encoder which is connected to all of the Match lines, e.g., one for each word in the CAM. The priority encoder is used to prioritize multiple matches and to compute and/or output a single Match address.

In general a CAM achieves its search performance by simultaneously comparing all entries stored in the memory with an externally applied "comparand." Words in the CAM which "match" the comparand result in a Match line HIGH (true) while all words that contain even a single bit that does not match the corresponding comparand bit result in a Match line LOW (false).

The line marked "Mask VSS" in FIG. 1 can be used as a "global" bit mask such that when MASK is asserted (HIGH, true or logic "1"), the corresponding bit position in every word in the CAM is eliminated from the compare function (i.e., it becomes a global "don't care" (forced match) logic value for every word in the CAM). Such global masking is useful in comparing or searching for ranges of entries.

In network systems handling multiple protocols and/or formats, such as bridges and routers, local bit masking is also useful in facilitating routing decisions. Locally disqualifying a given bit from participating in comparisons is expensive and difficult in conventional static CAMs because the storage element, an SRAM cell, is typically only able to store a "1" or a "0." Thus, static CAM cell area would have to nearly double to store a third, "masked" state. Placing a third state in memory read applications also requires a more complex implementation of the memory sense amplifier.

The work of Wade and Sodini as discussed in A Ternary Content Addressable Search Engine demonstrates a five(5) transistor Dynamic CAM cell (hereinafter called the "Wade cell") that stores a "mask" logic state. The Wade cell, however, has a poor signal-to-noise ratio, making it difficult to use in practical applications. This poor signal-to-noise ratio is caused in part by the direct coupling of the Match line output to the storage elements of the cell. The direct coupling of the output to the storage element can corrupt the value stored in the storage element when the Match line is read. Additional circuit elements may be required to decouple the output line from the storage element to make practical implementations possible with the Wade cell. However, the additional circuit components would greatly reduce the benefits (primarily a low transistor count) the Wade cell enjoys.

CAM cell density can be increased and, thus, the cost decreased, by using a dynamic memory storage element because such memory elements typically employ fewer circuit components. One such Dynamic CAM (DCAM) cell is discussed in U.S. Pat. No. 4,791,606, co-invented by Mr. Bruce Threewitt, the inventor of the present invention, and assigned to MUSIC Semiconductors, Inc. This conventional DCAM cell is shown in FIG. 2. Table 2 shows the logic functions of the DCAM cell. Note that with the exception of the complimentary Comparand input(/C), the logic function defined in Table 2 (for the DCAM cell) is the same logic function defined in Table 1 (for the static CAM cell).

TABLE 2

DCAM Cell Logic Function

| Data | C | /C | Match Line |
|---|---|---|---|
| 0 | 0 | 1 | 1 |
| 0 | 1 | 0 | 0 |
| 1 | 0 | 1 | 0 |
| 1 | 1 | 0 | 1 |

This DCAM cell is based on a common one-transistor, one-capacitor DRAM storage element comprising $Q_1$ and $C_1$, as shown in FIG. 2. The XNOR function is accomplished by $Q_2$, $Q_3$, $Q_4$ and $Q_5$, plus an implied external load impedance on the Match line. $Q_4$ and $Q_5$ are P-Channel MOSFETs and are arranged one above the other to consolidate corresponding gates and the N-well isolation region into a convenient shape for processing (i.e., a vertical stripe). Further, this cell can be adjacent to a mirror-image cell such that the N-well vertical stripe can be shared by two columns of cells alternated with two columns which share a P-well vertical stripe. This feature allows relatively denser packing than the static CAM cell of FIG. 1. However, this cell is single-ended and cannot store more than two possible logic states (i.e., cannot store a local "masked" logic state). A more complicated DRAM manufacturing process is also required to make the cell because of the P-Channel MOSFETS.

SUMMARY OF THE INVENTION

The present invention is a great improvement over the conventional CAM used in NAF applications. First, a very low-transistor-count, i.e., a very dense, CAM cell is disclosed. Second, a new CAM cell circuit configuration is disclosed providing operational isolation between the CAM data storage elements and the CAM output. Third, a new local masking logic feature is disclosed as well as its application in NAF. These and other improvements are described in more detail below.

DETAILED DESCRIPTION OF INVENTION

Figure 1:
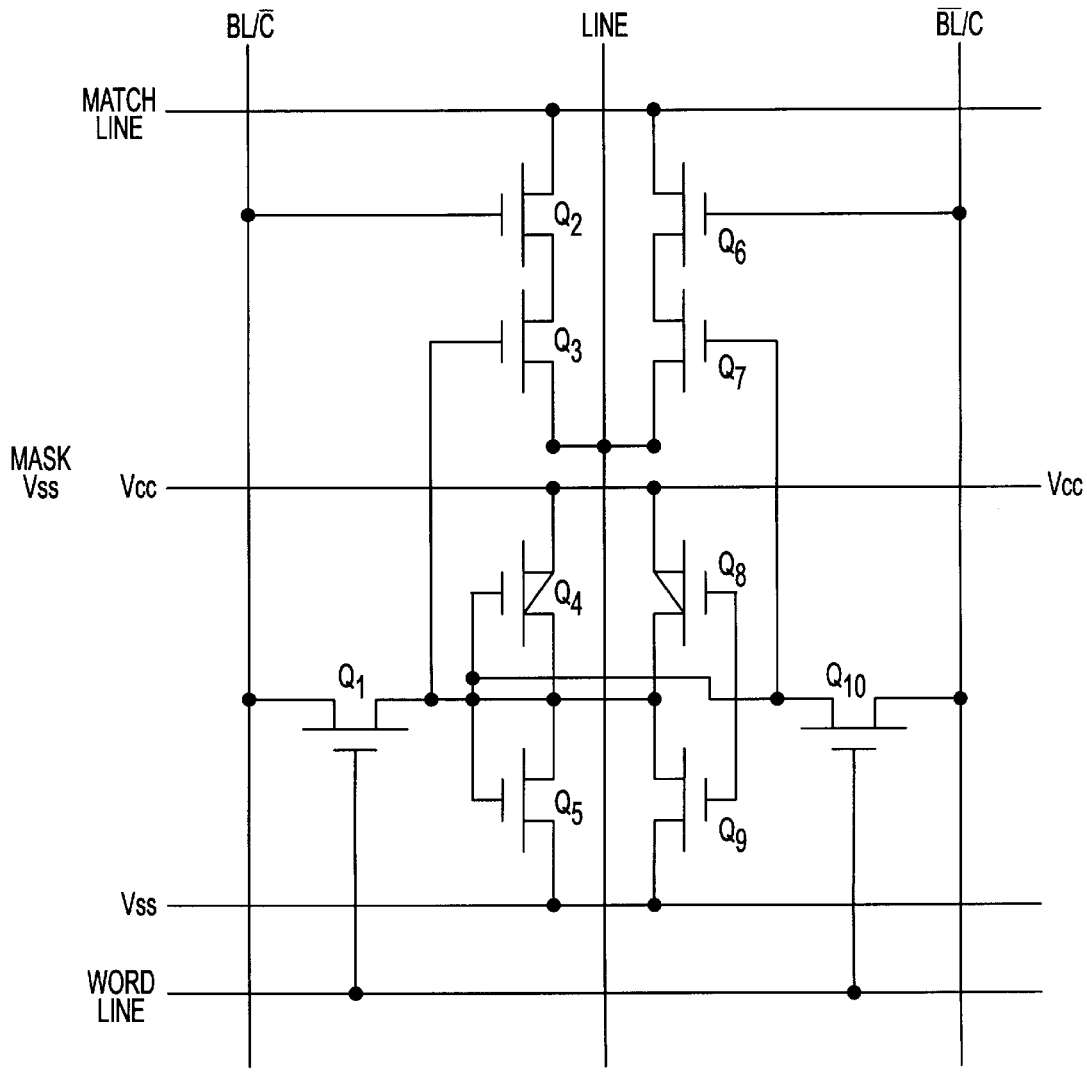
FIG. 1 depicts a circuit diagram of the "Nishimishi" Static Content Addressable Memory cell.
Figure 2:
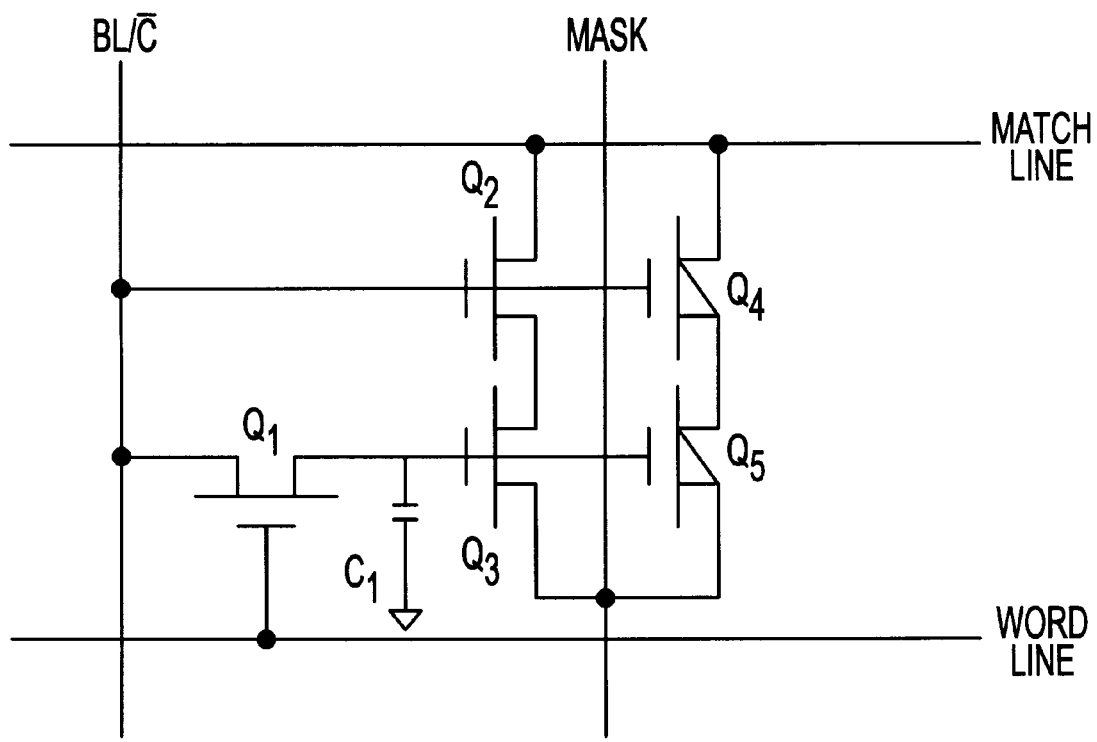
FIG. 2 depicts a conventional Dynamic Content Addressable Memory (DCAM) cell.
Figure 3:
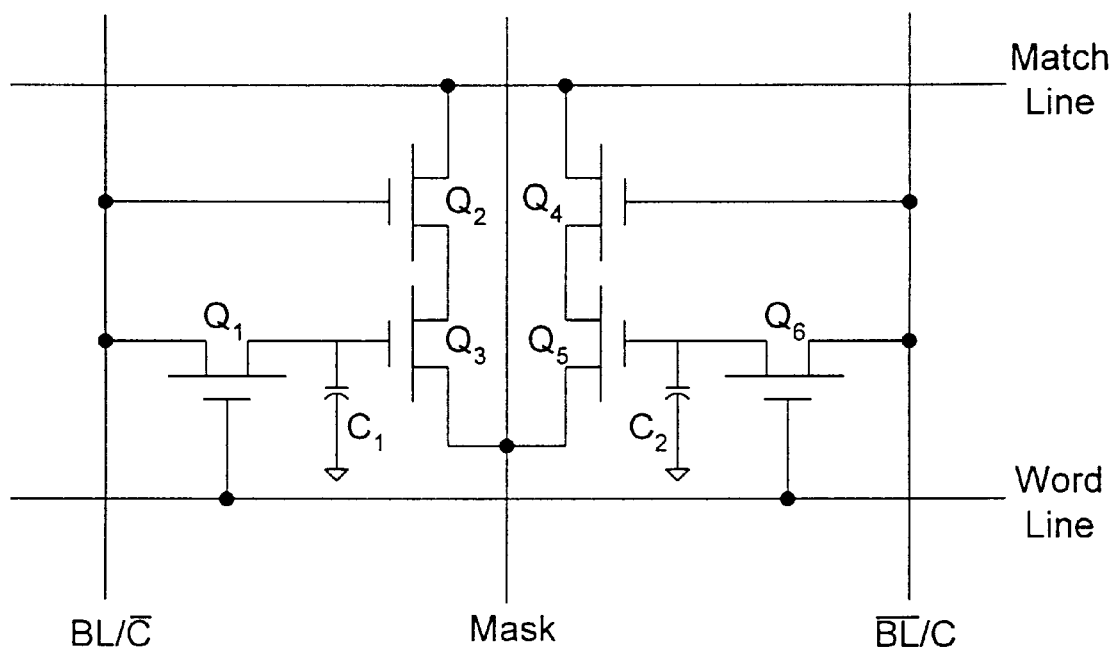
FIG. 3 depicts a Differential Dynamic Content Addressable Memory ($D^2CAM$) Cell.

The invention involves a Differential Dynamic Content Addressable Memory ($D^2CAM$) cell, which has significant improvements relative to the static CAM cell of FIG. 1, the DCAM cell of FIG. 2 and all other known CAM cells. FIG. 3 shows a Differential DCAM cell embodiment of the present invention. The $D^2CAM$ cell has an XNOR function realized in $Q_2$, $Q_3$, $Q_4$ and $Q_5$ and a two-transistor differential dynamic storage element realized in $Q_1/C_1$ and $Q_6/C_2$.

The $D^2CAM$ has a differential data input (e.g., BL/C and its complement /BL-C), a global "Mask" input, a "Word Line" input and a "Match Line" output. Table 3 shows the truth table for the $D^2CAM$ cell.

TABLE 3

Differential Dynamic CAM Truth Table

| DATA (BL) | Comparand | Match Line |
|---|---|---|
| 0 | 0 | 1 |
| 0 | 1 | 0 |
| 1 | 0 | 0 |
| 1 | 1 | 1 |
| M | X | 1 |

The "X" entry in Table 3 indicates a "don't care" logic value, and the "M" entry indicates a "masked" logic value. The differential bit lines improve the signal-to-noise ratio and allow the use of lower voltages and smaller storage capacitance. Smaller storage capacitance allows the storage element of the present invention to be realized in a smaller area with a simpler, less expensive process on the semiconductor, again facilitating a denser packing and less expensive manufacturing of the $D^2CAM$ cell on the semiconductor. The $D^2CAM$ circuit configuration also improves the cell's signal-to-noise ratio by decoupling the output line (providing operational isolation) from the cell's storage elements. In addition, the improved signal-to-noise ratio makes the $D^2CAM$ cell of the present invention practical for use in deployable applications.

The $D^2CAM$ storage function may be accomplished differentially by $Q_1/C_1$ and $Q_6/C_2$ by storing the appropriate charge on $C_1$ and/or $C_2$ to represent a "1" state of the cell as a whole or a "0" state of the cell as a whole. For example, when $Q_1/C_1$ holds a positive charge and $Q_6/C_2$ holds a negative (or no) charge relative to VSS (or Mask) the differential storage element may hold a "1" state. Conversely, when $Q_1/C_1$ holds a negative (or no charge) and $Q_6/C_2$ holds a positive charge relative to VSS (or mask) the differential storage element may hold a "0" state. This component realization of the present invention, shown in FIG. 3, uses memory components that will be periodically refreshed in accordance with conventional refresh circuitry and procedures. However, component realizations that do not require a refresh cycle (e.g. static data storage elements) are also within the scope of the present invention, as are other implementations of dynamic storage elements. For example, see U.S. patent application Ser. No. 08/760,823 filed Dec. 5, 1996, the relevant portions of which are incorporated herein by reference, wherein the subject matter and the claimed invention were at the time the invention was made, owned by, or subject to, an obligation for assignment to the same entity as the present invention.

Figure 4:
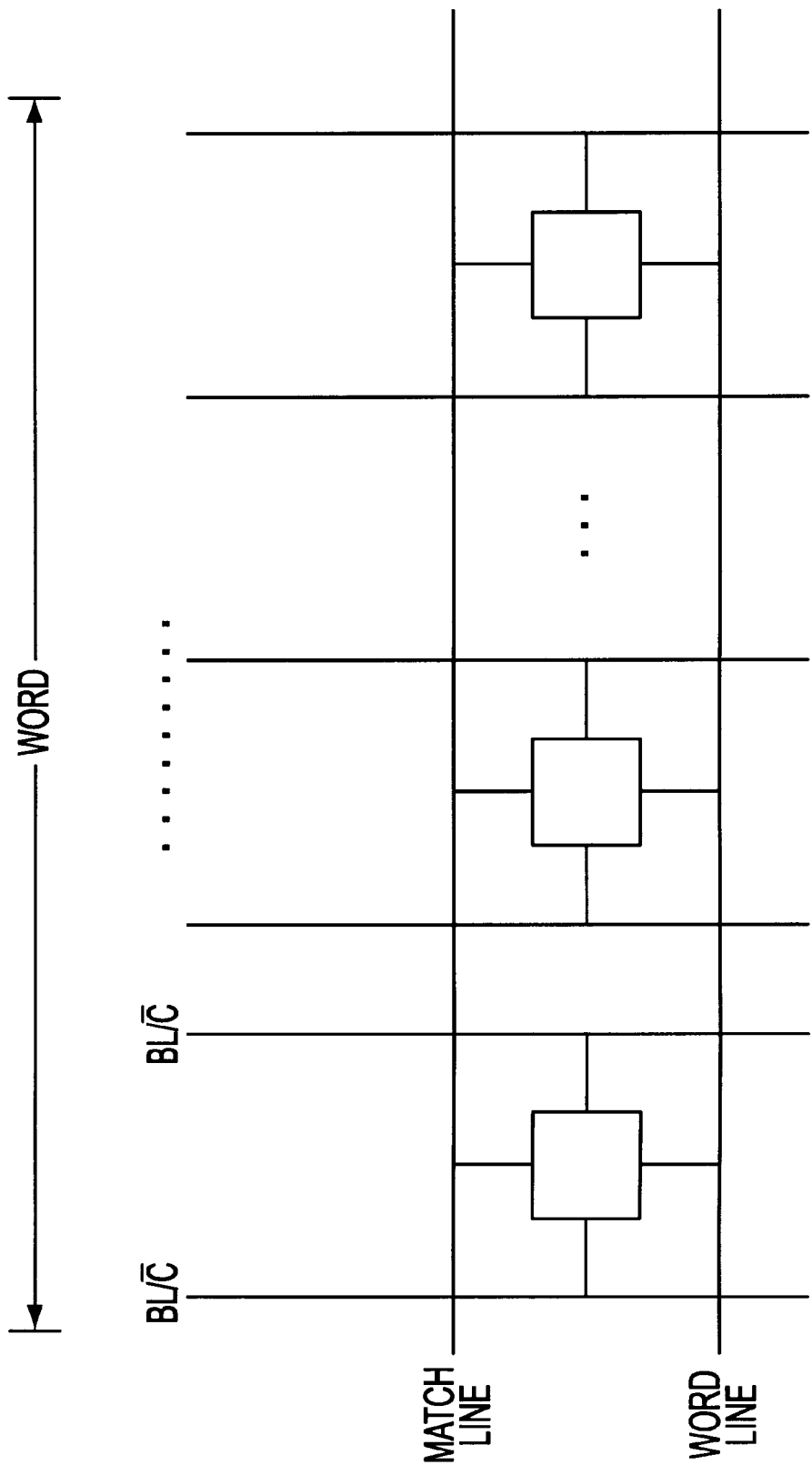
FIG. 4 depicts an array of $D^2CAM$ cells.
Figure 5:
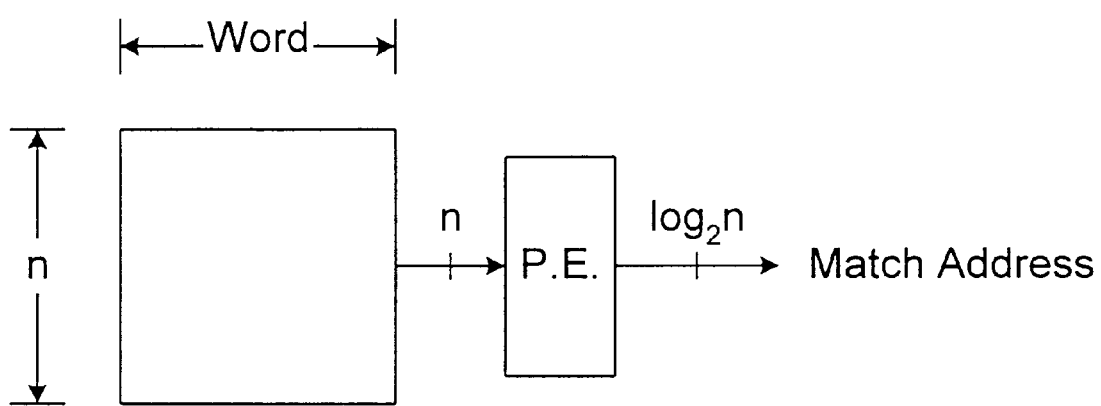
FIG. 5 depicts a content addressable memory array with a priority encoder output circuit.

An important aspect of the present invention is the ability to store a third ("mask")logic state in the $D^2CAM$ cell with conventional binary signaling. By storing a "0," or a "1" (preferably a "0") on both storage elements the cell stores a "mask" state which allows a local mask logic value to be stored within a given word entry. The global mask function is retained by the mask line input, which allows comparisons when the global mask line is LOW ("0") and forces a match condition when the global mask line is HIGH ("1"). The ability to store a "mask" logic state in each $D^2CAM$ cell allows bit-level masking of data stored in an array of $D^2CAM$ cells such as the array of cells shown in FIG. 4. The bit-level masking facilitates and/or enables the storing and comparing of an address range using the present invention and is beneficial in, inter alia, network address filtering applications.

The circuit disclosed and depicted in FIG. 3, the improved $D^2CAM$ cell, may comprise all N-Channel MOSFETs, thus allowing even denser packing than the conventional DCAM cell in FIG. 2. The cell embodiment using solely N-Channel MOSFETS also means that CMOS and other bi-polar fabrication technology may be avoided in manufacturing this embodiment of the present invention. Alternately, an all P-Channel embodiment of the cell is also within the scope of the present invention.

The present $D^2CAM$ cell may also utilize a parasitic capacitance (e.g. from the source-substrate) rather than an explicit capacitor to further decrease the cost of the storage element. Use of the parasitic capacitance in $Q_1$ and $Q_6$ allows an overall simplification of the manufacturing process of the storage elements ($Q_2/C_1$ and $Q_6/C_2$), thus, facilitating the use of a relatively lower cost SPAM-like process. A lower storage capacitance may be utilized with a relatively higher refresh rate. The optimal parasitic capacitance (or total effective capacitance) and the required refresh interval may depend on the particular fabrication process used to make the $D^2CAM$ of the present invention. Optimization techniques that balance the interrelated factors of circuit density and refresh rate are well known in the art.

In practical NAF applications, the $D^2CAM$ cell may use the NAF subsystem's synchronous clock as a refresh timer. Most NAF subsystems have a synchronous clock which may be used to render the $D^2CAM$ refresh transparent to the user. This feature improves performance since periodic refreshing will not have to borrow cycles from regular system functions.

Turning back to FIG. 3, note that the $D^2CAM$ cell of the present invention may be configured with only six (6)

N-Channel transistors. This low transistor count allows a higher density fabrication of the $D^2CAM$ cell than with conventional CAM cells. The new $D^2CAM$ cell with attendant priority encoder may have the same or even slightly higher approximate density (i.e., the same cost per bit) as a conventional SRAM cell fabricated in a technology having the same line width and/or design rules. As in conventional designs, the $D^2CAM$ cell may use an external pull-up for the Match line output.

$D^2CAM$ cell operation can be more specifically described as follows. To store a "1" in the $D^2CAM$ cell the voltage on BL/C is set to a logic HIGH and the voltage on /BL-C line is set to a logic LOW. The voltage on the Word line may be raised above the threshold corresponding to a logic HIGH which places a HIGH on the gates of $Q_1$ and $Q_6$. The HIGH on the gate of $Q_1$ allows current to flow from BL/C through $Q_1$, charging $C_1$ to a HIGH logic state. The HIGH-logic-state Word line applies a HIGH on the gate of $Q_6$ and allows current to flow from $C_2$ through $Q_6$ to the /BL-C line, discharging $C_2$ to a LOW logic state.

To store a "0" on the $D^2CAM$ cell, the BL/C line is set LOW, and the /BL-C line is set HIGH. The Word line is enabled (HIGH) which places a HIGH on the gates of $Q_1$ and $Q_6$. The HIGH on the gate of $Q_1$ allows current to flow from $C_1$ through $Q_1$ to the BL/C line, discharging $C_1$ to a LOW logic state. The Word line HIGH on the gate of $Q_6$ allows current to flow from the /BL-C line through $Q_6$ to $C_2$, charging $C_2$ to a HIGH logic state. In both cases (storing a "1" and storing a "0") the storage action occurs when the voltage on the Word line is driven to a LOW logic state, turing both $Q_1$ and $Q_6$ off and isolating $C_1$ and $C_2$.

To store a "mask" logic value in the $D^2CAM$ cell, the BL/C line is set LOW, and the /BL-C line is set LOW while the Word line is set HIGH, thus placing a HIGH logic state on the gates of $Q_1$ and $Q_6$. The HIGH on the gate of $Q_1$ allows current to flow from $C_1$ through $Q_1$ to the BL/C line, discharging $C_1$. The HIGH on the gate of $Q_6$ allows current to flow from $C_2$ through Q6 to the /BL-C line, discharging $C_2$. Again, storage occurs when the Word line is driven LOW.

The match sequence for the $D^2CAM$ when the cell stores a "1" and a comparand bit containing a "1" is input is as follows. The global mask line ("mask") for this explanation is set LOW to disable global masking. A comparand "1" places a LOW on the BL/C line and a HIGH on the /BL-C line. The LOW BL/C line places a LOW on the gate of $Q_2$. The LOW on the gate of $Q_2$ keeps $Q_2$ from conducting, thus, keeping the match line output HIGH (other conditions permitting). Since the match line has an external pull-up, it stays HIGH as long as the cell does not pull it to a LOW by electrically connecting it to a LOW logic state. The HIGH /BL-C line puts a HIGH on the gate of $Q_4$, allowing $Q_4$ to conduct. However, when the $D^2CAM$ stores a "1," $C_2$ presents a LOW on the gate of $Q_5$. The LOW on the gate of $Q_5$ stops the conduction of $Q_5$, allowing the match line to remain HIGH. Thus, when a "1" is stored in the $D^2CAM$ cell and a comparand value of "1" is applied, the $D^2CAM$ cell returns the appropriate match line HIGH condition. When the $D^2CAM$ cell is holding a "0" state, and a comparand value "1" is applied, the $D^2CAM$ cell returns a LOW match line. When the $D^2CAM$ holds a 0 state, $C_1$ is holding a LOW, and $C_2$ is holding a HIGH. When a comparand value of "1" is applied (a "mismatch" condition) the /BL-C line is set HIGH, and the BL/C line is set LOW. The HIGH /BL-C line places a HIGH on the gate of $Q_4$, causing $Q_4$ to conduct. The HIGH stored in $C_2$ places a HIGH on the gate of $Q_5$. The HIGH on the gate of $Q_5$ causes $Q_5$ to conduct. Thus, in this condition, both $Q_4$ and $Q_5$ are conducting, and the match line is pulled LOW via $Q_4$ and $Q_5$ to the LOW on the global mask line. As discussed above, the global mask line is LOW when the global mask is disabled. Thus, the $D^2CAM$ cell returns a LOW match line output when the $D^2CAM$ holds a "0" state and a comparand value of "1" is applied.

When the $D^2CAM$ stores a "0", and a comparand of "0" is applied, the $D^2CAM$ returns a HIGH match line. Again, the global mask line ("mask") may be set LOW to disable global masking. A comparand of "0" places a LOW on the /BL-C line and a HIGH on the BL/C line. The HIGH BL/C line places a HIGH on the gate of $Q_2$, causing $Q_2$ to conduct. However, because the $D^2CAM$ cell is storing a "0," $C_1$ places a LOW on the gate of $Q_3$. The LOW on the gate of $Q_3$ stops $Q_3$ from conducting, thereby keeping the match line output HIGH (other conditions permitting). The LOW /BL-C input places a LOW on the gate of $Q_4$. The LOW on the gate of $Q_4$ keeps $Q_4$ from conducting, thereby keeping the match line output HIGH. Thus, the $D^2CAM$ cell allows a HIGH match line when the $D^2CAM$ holds a "0," and a "0" comparand is applied.

When the $D^2CAM$ cell stores a "1," and a comparand value of "0" is applied, the $D^2CAM$ cell returns a LOW match line output. A "0" value comparand places a LOW on the /BL-C line and a HIGH on the BL/C line. The LOW on the /BL-C line places a LOW on the gate of $Q_4$. The LOW on the gate of $Q_4$ disables $Q_4$ and stops the connection of the match line output to the global mask line, thus, keeping the match line output HIGH (other conditions permitting). The BL/C HIGH input places a HIGH on the gate of $Q_2$. The HIGH on the gate of $Q_2$ causes $Q_2$ to conduct. Since the $D^2CAM$ cell is storing a "1," $C_1$ holds a HIGH value. Thus, $C_1$ places a HIGH on the gate of $Q_3$, causing $Q_3$ to conduct thereby with $Q_2$ pulling down the match line output. Thus, when the $D^2CAM$ holds a "1" value, and a comparand value of "0" is applied, the match line output from the cell is LOW.

The $D^2CAM$ cell always allows a HIGH match line output when the $D^2CAM$ is storing a third or "masked" state. When the $D^2CAM$ holds the masked state, both $C_1$ and $C_2$ may be holding a LOW state. Therefore, $C_1$ may place a LOW on the gate of $Q_3$, and $C_2$ may place a LOW on the gate of $Q_5$. Thus, neither $Q_3$ nor $Q_5$ is conducting and will not allow the match line to discharge through $Q_2/Q_3$ or $Q_4/Q_5$. Thus, when the $D^2CAM$ cell holds the "masked" state, the $D^2CAM$ cell always returns a HIGH match line output for any comparand value.

Note that the existence of any conducting (mismatching) cell that is not masked (globally or locally), in a CAM array (supporting, for example, a digital word of data) causes the corresponding match line to be LOW. All CAM cells in a CAM word must be non-conducting, (matching) or masked to allow the corresponding match line to be HIGH.

Figure 6:
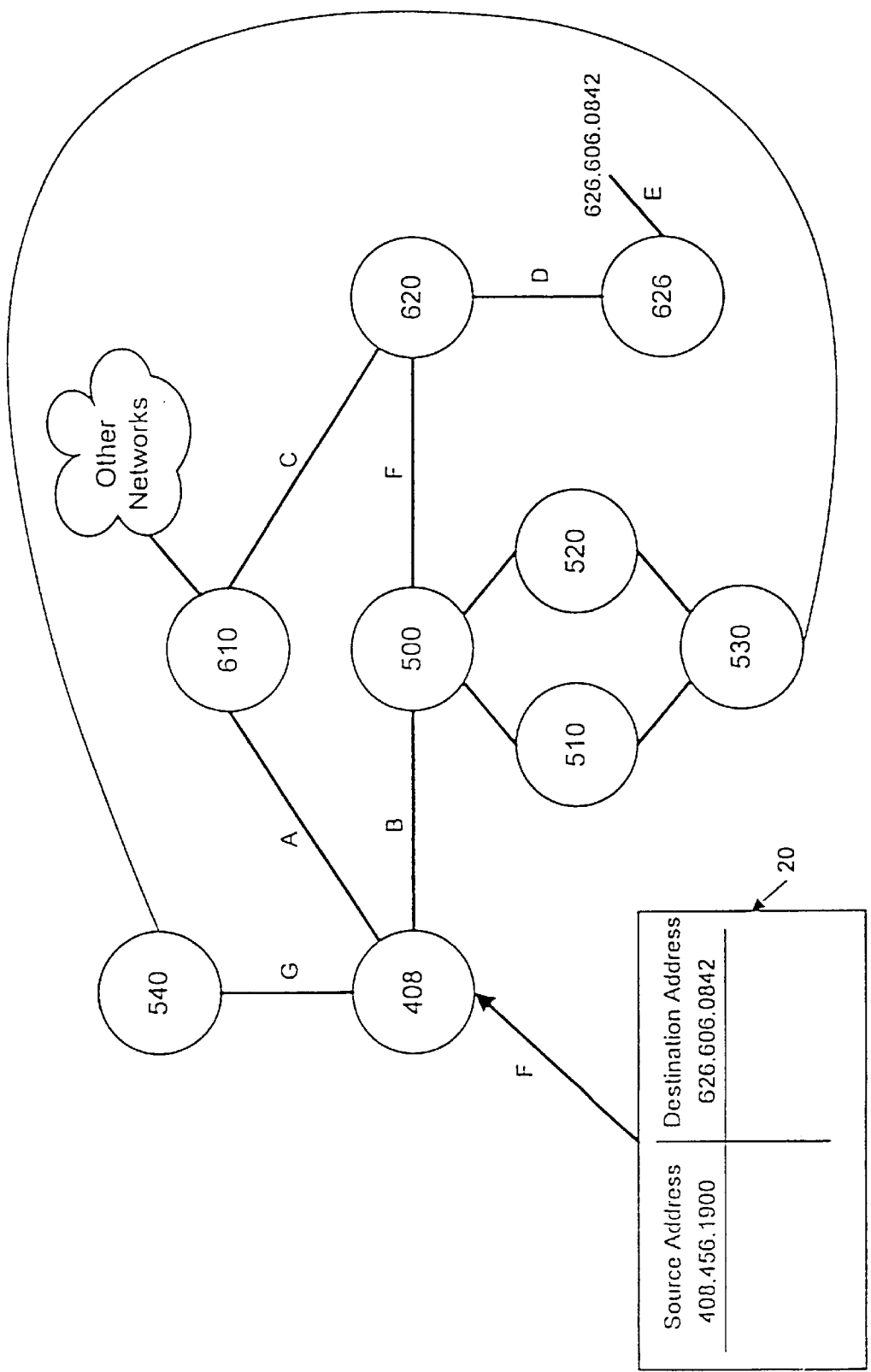
FIG. 6 depicts a representative communication network exemplifying a use for the local bit masking feature of the present invention.

An illustrative application of the present invention is the ability to use the local "masked" state to represent a range of addresses for a routing decision. A simple network is depicted in FIG. 6. The network has nodes and connections, represented by the circles and lines, respectively. A node represents a router or switch for the data packets in the network. A data packet 20 is shown entering the network at node 408 with a 408.456.1900 source address and a destination address of 626.606.0842. As well known to those in the data switch and/or router arts, node 408 must make a routing decision for this packet. The classic routing analysis includes determining the least-cost routing path. Here, the possible routes are ACDE or BFDE. Each link A,B,C,D,E, and F can have an associated "cost" assigned to the link.

Thus, the path ACDE has a total cost of A plus C plus D plus E and likewise, the path BFDE has a total cost of B plus F plus D plus E. It is understood the "cost" of the links may vary dynamically with the loading of the network. Therefore, a least-cost routing decision may be a dynamic analysis.

A separate process may be used to solve and pre-determine the least-cost routing solution. For the example here, assume that the B link is under heavy utilization, and the A link, C link, and F link are lightly utilized. Therefore, the cost assigned to the BFDE path is higher than the ACDE path. Thus, for the purpose of node 408 the packet of the instant example should properly be routed to port A which represents the lower cost routing decision.

The $D^2CAM$ can work with a pre-determined methodology in the priority encoder to encode a port priority for routing decisions. The priority encoder output may function with a predetermined methodology, e.g., a lower matched address takes priority over a higher matched address from the $D^2CAM$ output. Thus, for the purpose of this example the CAM at node 408 may store the following routing solution:

|  | CAM ADDRESS | OUTPUT |
|---|---|---|
| LOWEST | 6MM.MMM.MMMM | PORT A |
|  | 6MM.MMM.MMMM | PORT B |
|  | 54M.MMM.MMMM | PORT G |
|  | 5MM.MMM.MMMM | PORT B |
|  | 5MM.MMM.MMMM | PORT A |
|  | 408.456.1900 | PORT H |
| HIGHEST | MMM.MMM.MMMM | PORT B |

Where "M" denotes the masked state.

The $D^2CAM$ can expedite the routing decision for the packet entering node 408 with a destination address of 626.606.0842 by returning the first two 6MM.MMM.MMMM entries and the MMM.MMM.MMMM entry as true. Since the priority encoder is pre-determined to select the lowest returned address, the output of the $D^2CAM$ in the router is Port A. Note that if the pre-determined (or periodically recalculated) least-cost path would have been Port B, then the Port B data would be stored in the lower memory address.

Dynamically changing the priority encoder or output selection from, for example, the lowest address to the second lowest address is within the scope of the present invention. Thus, the priority encoder may be instructed to return the second best routing solution.

Note that the 54M.MMM.MMMM utilizes the local bit masking feature of the $D^2CAM$. If, assuming the best routing decision at node 408 for packets with a destination address in the 54M.MMM.MMM range is port G, then the address table in node 408 should contain the 54M.MMM.MMMM address range at a lower address than the 5MM.MMM.MMMM address range. Thus, the global mask line for the second position address digit, i.e., the "4," would not determine the least cost routing for all packets in the 5MM.MMM.MMMM address range.

Here, the $D^2CAM$ can directly store the local bit mask in each address entry. Thus, the packets in the 5MM.MMM.MMMM address range are properly routed based on the second digit address range.

These and other applications and modifications of the $D^2CAM$ invention described and discussed herein shall be known to those skilled in the art from this disclosure and modifications thereby are within the scope of the present invention.

Therefore, I claim:

1. A three-state content addressable memory cell comprising:
   a comparison element operationally connected to a match line output that outputs a signal having (i) a first logic state in response to two inputs having different logic states and (ii) a second logic state in response to two inputs having the same logic states;
   a first data storage element having an input operationally connected to a first data input line and an output operationally connected to said comparison element;
   a second data storage element having an input operationally connected to a second data input line and an output operationally connected to an input to said comparison element;
   a global mask input operationally connected to said comparison element, said global mask input providing a mask logic function for said content addressable memory cell;
   said content addressable memory cell storing a masked state by storing the same logic state in said first and said second storage elements;
   said match line output having no direct connection to said first and second data storage elements thereby providing operational isolation between said match line output and said storage elements.

2. The content addressable memory of claim 1 further comprising:
   a memory refresh circuit operationally connected to said first and said second data storage elements.

3. The three-state content addressable memory cell of claim 1 wherein:
   said comparison element is directly connected to said match line output.

4. The content addressable memory of claim 1 wherein:
   said comparison element comprises four transistors having a first channel type, and each of said first and second data storage elements comprises a transistor of said first channel type.

5. The content addressable memory of claim 4, wherein said first channel type is N-Channel type.

6. The content addressable memory of claim 1 wherein said first data storage element and said second storage element each have a transistor and a capacitor.

7. The content addressable memory of claim 6 wherein:
   a parasitic capacitance of each of said transistors is in lieu of an explicit capacitance element of each said data storage elements.

8. A method of network address filtering using a content addressable memory and a priority encoder, said priority encoder having a pre-determined methodology for selecting an output from said content addressable memory, comprising:
   storing a first network address expressed at least in part as one or more mask logic values in said content addressable memory, a storage location in said content addressable memory working in co-operation with said pre-determined methodology in said priority encoder thereby encoding a network routing priority;
   inputting a second network address to said content addressable memory;
   receiving in response to said step of inputting a second network address, an output from said priority encoder that represents a network switch port on a network switch, said priority encoder output being determined in accordance with said encoded network routing priority.

9. The method of claim 8 further comprising:

receiving an input at said priority encoder to select a second output from said content addressable memory, said second output representing a second routing priority.

10. A content addressable memory comprising:

a first data storage element;

a second data storage element;

a comparison element operationally connected to said first data storage element and said second data storage element, said content addressable memory storing a mask logic value by storing a predetermined logic value in said first and said second data storage elements, said comparison element providing operational isolation between an output of said content addressable memory and said first and said second data storage elements; and a global mask input operationally connect to said comparison element, said global mask input providing a mask logic function for said content addressable memory.

11. The content addressable memory of claim 10 further comprising:

refresh circuitry operationally connected to said first and said second storage elements.

12. The apparatus of claim 10 wherein:

said comparison element is directly connected to a match line output.

13. The content addressable memory of claim 10 wherein said first and said second data storage elements and said comparison element are all the same type semiconductor material.

14. The content addressable memory of claim 13 where said semiconductor material is N-type semiconductor material.

15. A content addressable memory array comprising:

more than one content addressable memory cell, each said content addressable memory cells capable of storing a mask logic value, said content addressable memory array having at least one output from said content addressable memory cell operationally connected to an output of another content addressable memory cell in said content addressable memory array;

said output from each of said content addressable memory cells operationally isolated from a storage element in each of said content addressable memory cells; and at least one global mask line operationally connected to said content addressable memory cells; said at least one global mask line providing a global mask logic function to each bit in a column or a row of said content addressable memory array.

16. The content addressable memory array of claim 15 further comprising:

a priority encoder operationally connected to one or more of said output(s) from said content addressable memory array, said priority encoder having a pre-determined priority design, said priority encoder working in co-operation with a mask logic value capability in said content addressable memory array to encode a range of data priority.

17. The apparatus of claim 15 wherein:

said comparison element is directly connected to a match line output.

18. A network address filter comprising:

a content addressable memory;

a priority encoder, said priority encoder having a pre-determined methodology for selecting an output from said content addressable memory;

said content addressable memory operable to store a network address expressed at least in part as one or more mask logic values and operable to receive a second network address; and said content addressable memory having a storage location working in cooperation with said predetermined methodology in said priority encoder.

19. The network address filter of claim 18 further comprising:

said priority encoder operable to select a second output from said content addressable memory, said second output representing a second routing priority.

* * * * *